(12) United States Patent
Shih

(10) Patent No.: US 9,437,794 B2
(45) Date of Patent: Sep. 6, 2016

(54) METHOD OF FABRICATING A FLIP CHIP LIGHT EMITTING DIODE (FCLED) DIE HAVING N-CONDUCTOR LAYER

(71) Applicant: SemiLEDS Optoelectronics Co., Ltd., Chu-Nan (CN)

(72) Inventor: Yi-Feng Shih, Chu-Nan (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 15/017,707

(22) Filed: Feb. 8, 2016

(65) Prior Publication Data
US 2016/0181494 A1    Jun. 23, 2016

Related U.S. Application Data

(63) Continuation-in-part of application No. 14/341,815, filed on Jul. 27, 2014.

(51) Int. Cl.

| | |
|---|---|
| *H01L 29/06* | (2006.01) |
| *H01L 33/62* | (2010.01) |
| *H01L 33/06* | (2010.01) |
| *H01L 33/10* | (2010.01) |
| *H01L 33/32* | (2010.01) |
| *H01L 33/00* | (2010.01) |

(52) U.S. Cl.
CPC ............. *H01L 33/62* (2013.01); *H01L 33/007* (2013.01); *H01L 33/06* (2013.01); *H01L 33/10* (2013.01); *H01L 33/32* (2013.01); *H01L 2933/0066* (2013.01)

(58) Field of Classification Search
CPC ..... H01L 33/005; H01L 33/06; H01L 33/38; H01L 33/60; H01L 33/62
See application file for complete search history.

(56) References Cited

U.S. PATENT DOCUMENTS

| | | |
|---|---|---|
| 2004/0036051 A1 | 2/2004 | Sneh |
| 2011/0210357 A1 | 9/2011 | Kaiser |
| 2016/0027978 A1 | 1/2016 | Shih |

OTHER PUBLICATIONS

U.S. Appl. No. 14/341,815, Office Action dated Jan. 20, 2016, pp. 1-12.
U.S. Appl. No. 14/341,815, Notice of Allowance dated May 6, 2016, pp. 1-7.

*Primary Examiner* — Robert Bachner
(74) *Attorney, Agent, or Firm* — Stephen A. Gratton

(57) ABSTRACT

A method for fabricating a flip chip light emitting diode (FCLED) die includes forming an epitaxial stack on a carrier substrate having an n-type confinement layer, a multiple quantum well (MQW) layer, and a p-type confinement layer, forming a mirror layer on the p-type confinement layer, forming an n-trench in the n-type confinement layer, forming an n-conductor layer in the n-trench on the n-type confinement layer, forming a p-metal layer on the p-type confinement layer, forming a first electrical isolator layer on the n-conductor layer and a second electrical isolator layer on the p-metal layer, forming a p-pad on the first electrical isolator layer, and forming an n-pad the second electrical isolator layer.

10 Claims, 15 Drawing Sheets

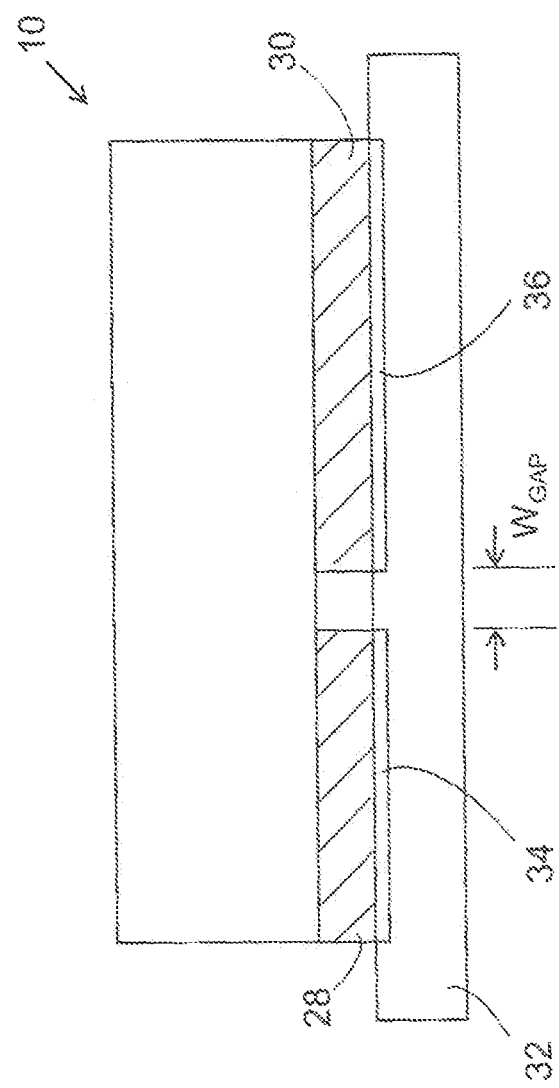

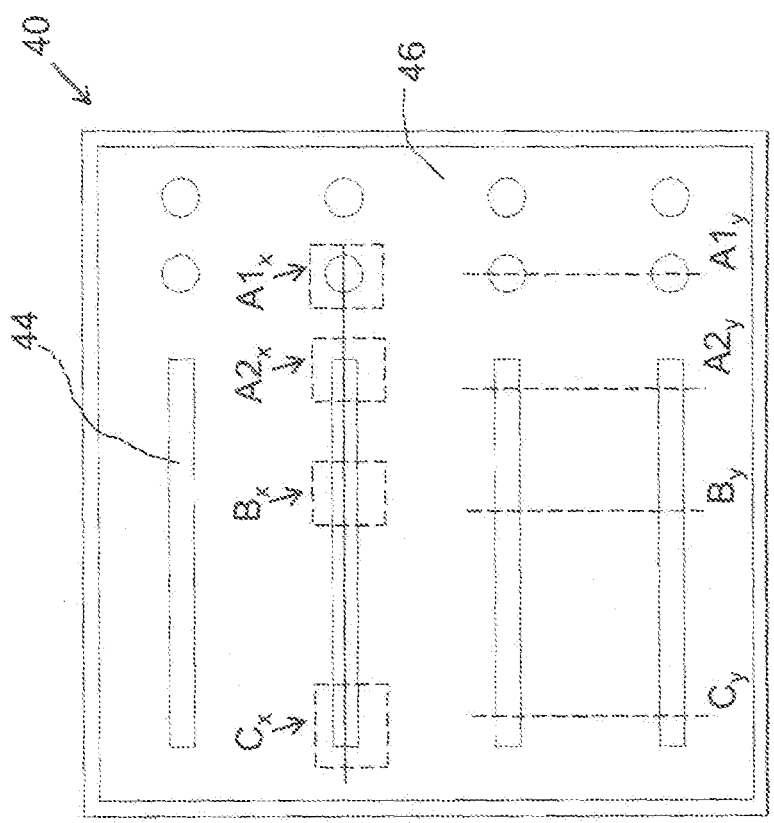

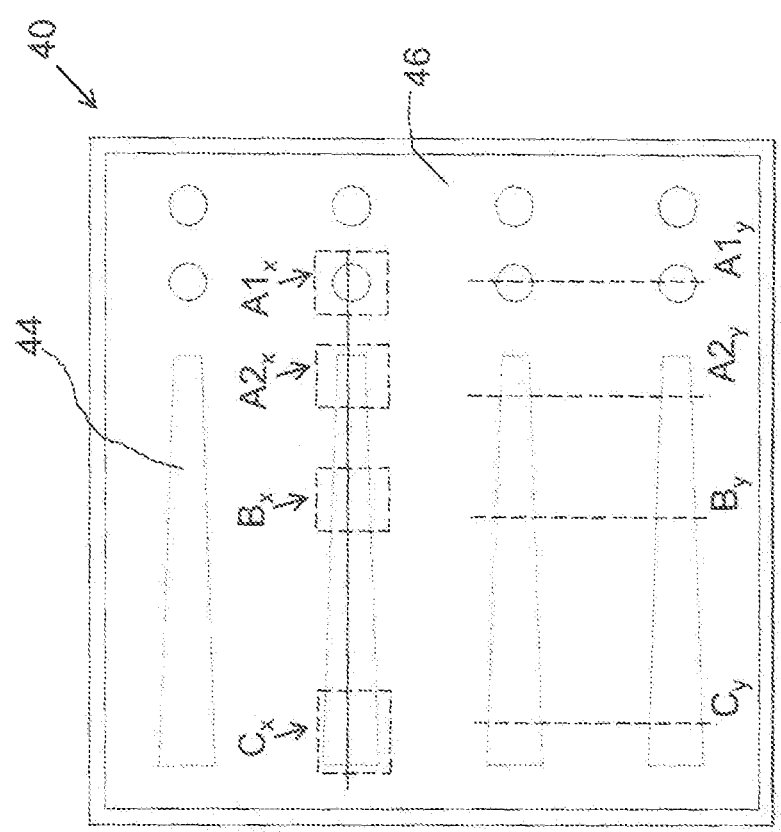

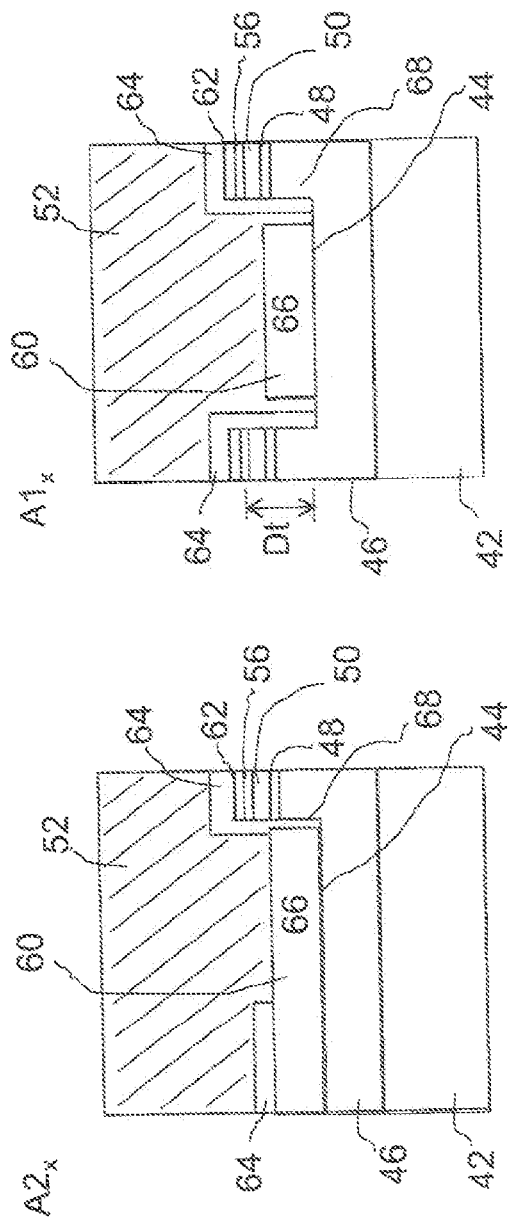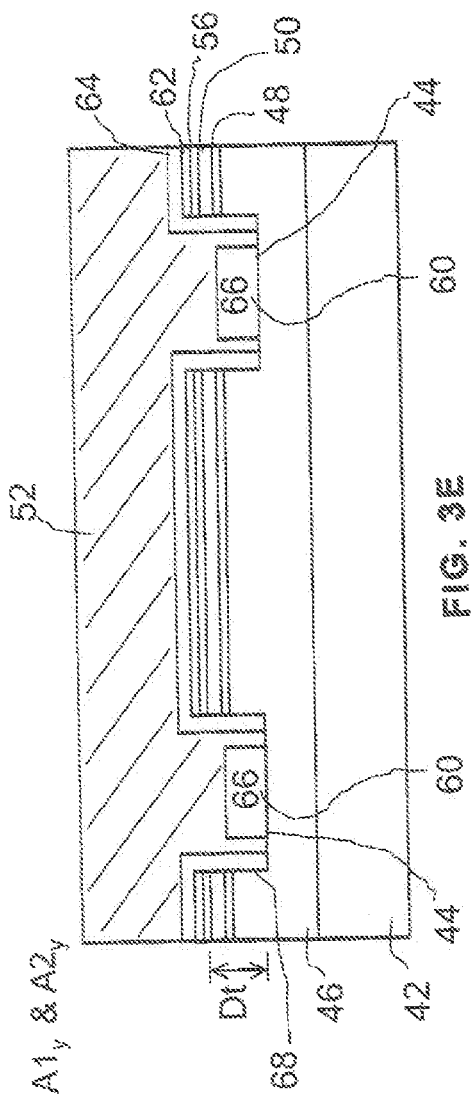

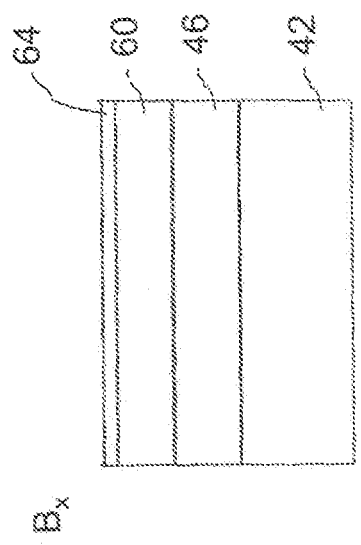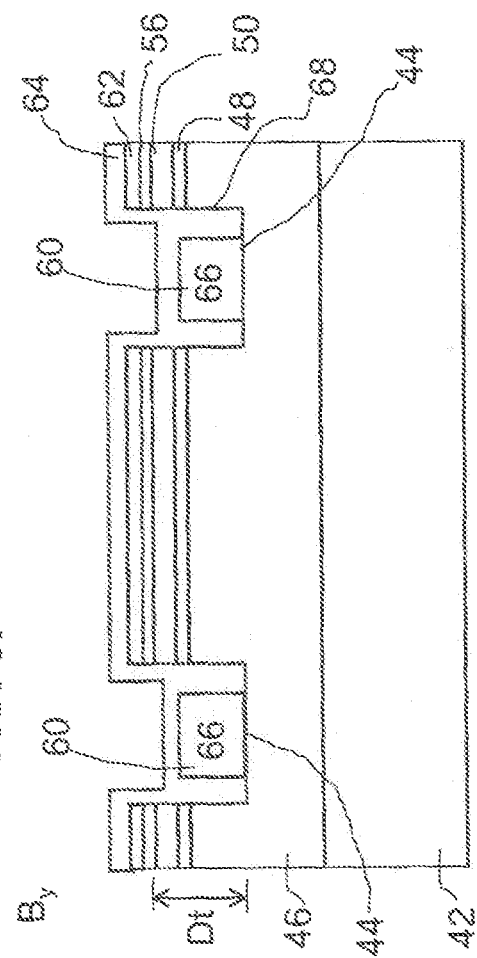

METHOD OF FABRICATING A FLIP CHIP LIGHT EMITTING DIODE (FCLED) DIE HAVING N-CONDUCTOR LAYER

CROSS REFERENCE TO RELATED APPLICATIONS

This application is a continuation-in-part of Ser. No. 14/341,815 filed Jul. 27, 2014.

FIELD

This disclosure relates generally to flip chip light emitting diode (FCLED) dice and particularly to a flip chip light emitting diode (FCLED) die having an n-conductor layer, and to a method for fabricating the flip chip light emitting diode (FCLED) die.

BACKGROUND

One type of prior art flip chip light emitting diode (FCLED) die 10 is shown in FIGS. 1A-1B. As shown in FIG. 1B, during fabrication the flip chip light emitting diode (FCLED) die 10 includes a substrate 12, and an epitaxial stack 14 on the substrate 12. The epitaxial stack 14 includes an n-type confinement layer 16, a multiple quantum well (MQW) layer 18 in electrical contact with the n-type confinement layer 16 configured to emit electromagnetic radiation, and a p-type confinement layer 20 in electrical contact with the multiple quantum well (MQW) layer 18. The flip chip light emitting diode (FCLED) die 10 also includes a mirror layer 22, a p-metal layer 24 in electrical communication with the p-type confinement layer 20, and a p-pad 28 in electrical communication with the p-type confinement layer 20 via the p-metal layer 24.

In addition, the flip chip light emitting diode (FCLED) die 10 includes an electrical isolator layer 26 configured to electrically isolate the p-pad 28 and the p-metal layer 24. The flip chip light emitting diode (FCLED) die 10 also includes a plurality of n-pads 30 in electrical contact with the n-type confinement layer 16. As shown in FIG. 1A, the p-pad 28 extends along one side edge of the flip chip light emitting diode (FCLED) die 10, and the n-pads 30 extend generally parallel to the p-pad 28. As shown in FIG. 2, during a packaging process, the flip chip light emitting diode (FCLED) die 10 can be flip chip mounted to a module substrate 32 with the p-pad 28 bonded to a p-electrode 34 on the module substrate 32, and with the n-pads 30 bonded to n-electrodes 36 on the module substrate 32.

One characteristic of the flip chip light emitting diode (FCLED) die 10 is that the p-pad 28 and the n-pads 30 are separated by a gap $W_G$. The size of the gap $W_G$ affects the output radiation of the flip chip light emitting diode (FCLED) die 10, particularly along the outside edge of the p-pad 28. For example, if the gap $W_G$ is relatively large, then the distance between the p-pad 28 and the n-pads 30 would also be large, and the output radiation along the outside edge of the p-pad 28 would be low. The width $W_P$ of the p-pad 28 is also dependent on the size of the gap $W_G$, such that a smaller width $W_P$ can present problems during a subsequent packaging process.

Another characteristic of the flip chip light emitting diode (FCLED) die 10 is that $W_G$ cannot be made so small that electrical shorting can occur between the p-pad 28 and the n-pad 30. These conflicting characteristics present a dilemma for achieving the optimal sizes for the gap width $W_G$, the width $W_P$ of the p-pad 28, and the width $W_N$ of the n-pads 30. The present disclosure provides a solution for solving this dilemma and for improving the output radiation of a flip chip light emitting diode (FCLED) die. In addition, the present disclosure provides a method for fabricating flip chip light emitting diode (FCLED) dice that does not require additional masks, and does not adversely affect current process windows.

However, the foregoing examples of the related art and limitations related therewith are intended to be illustrative and not exclusive. Other limitations of the related art will become apparent to those of skill in the art upon a reading of the specification and a study of the drawings. Similarly, the following embodiments and aspects thereof are described and illustrated in conjunction with a flip chip light emitting diode (FCLED) die which are meant to be exemplary and illustrative, not limiting in scope.

SUMMARY

A flip chip light emitting diode (FCLED) die includes an epitaxial stack comprising a p-type confinement layer, a multiple quantum well (MQW) layer in electrical contact with the p-type confinement layer configured to emit electromagnetic radiation, and an n-type confinement layer in electrical contact with the multiple quantum well (MQW) layer. The flip chip light emitting diode (FCLED) die also includes a p-pad in electrical communication with the p-type confinement layer via a p-metal layer, and an n-pad in electrical contact with the n-type confinement layer. The flip chip light emitting diode (FCLED) die also includes an n-conductor layer formed in a trench on the n-type confinement layer. The n-conductor layer is configured as a conductive trace having an n-end in electrical contact with the n-pad, and a p-end located subjacent to the p-pad but electrically insulated from the p-pad.

A method for fabricating the flip chip light emitting diode (FCLED) die includes the steps of forming an epitaxial stack on a carrier substrate having an n-type confinement layer, a multiple quantum well (MQW) layer, and a p-type confinement layer. The method also includes the steps of forming a mirror layer on the p-type confinement layer, forming an n-trench in the n-type confinement layer, forming an n-conductor layer in the n-trench on the n-type confinement layer, and forming a p-metal layer on the p-type confinement layer. The method also includes the steps of forming a first electrical isolator layer on the n-conductor layer and a second electrical isolator layer on the p-metal layer, forming a p-pad on the first electrical isolator layer, and forming an n-pad the second electrical isolator layer.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIG. 2 is a schematic side elevation view of the prior art flip chip light emitting diode (FCLED) die flip chip mounted to a module substrate;

FIG. 3B is a schematic cross sectional view of the flip chip light emitting diode (FCLED) die;

FIG. 3C is a schematic cross sectional view of the flip chip light emitting diode (FCLED) die;

FIG. 3E is a schematic cross sectional view of the flip chip light emitting diode (FCLED) die taken along section lines $A1_y$ and $A2_y$.

FIG. 3F is an enlarged schematic cross sectional view of the flip chip light emitting diode (FCLED) die taken along line $A2_x$;

FIG. 3G is an enlarged schematic cross sectional view of the flip chip light emitting diode (FCLED) die taken along line $A1_x$;

FIG. 3H is an enlarged schematic cross sectional view of the flip chip light emitting diode (FCLED) die taken along line $B_y$;

FIG. 3I is an enlarged schematic cross sectional view of the flip chip light emitting diode (FCLED) die taken along line $B_x$;

DETAILED DESCRIPTION OF THE PREFERRED EMBODIMENTS

Figure 1A:
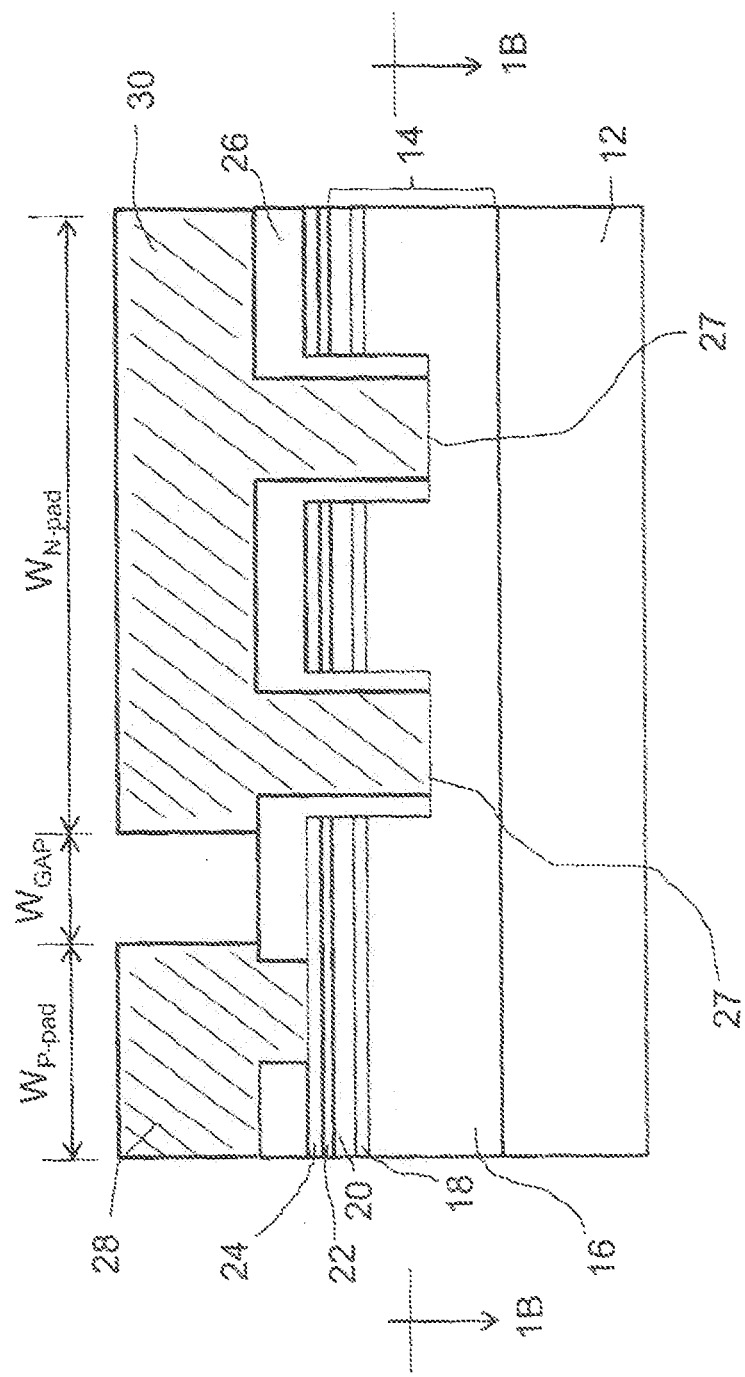
FIG. 1A is a schematic bottom view of a prior art flip chip light emitting diode (FCLED) die.
Figure 1C:
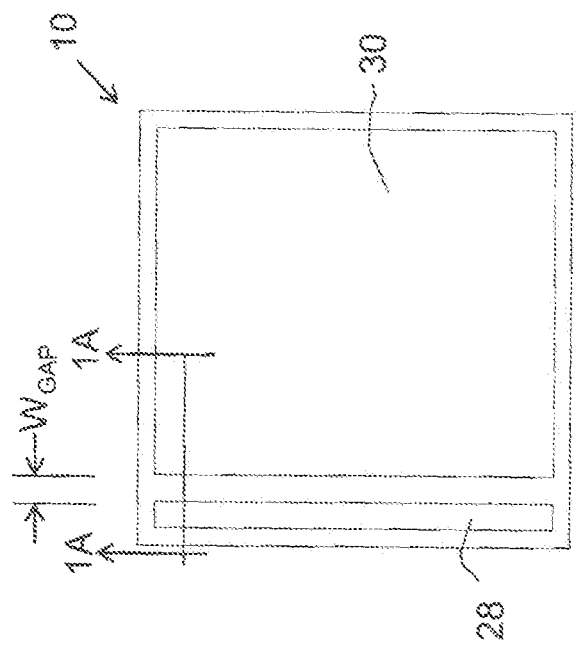
FIG. 1C is a schematic bottom view of the prior art flip chip light emitting diode (FCLED) die.
Figure 1B:
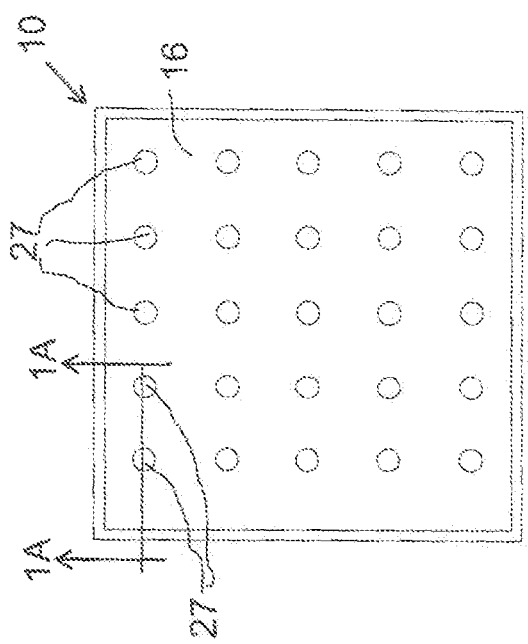
FIG. 1B is a schematic cross sectional view of the prior art flip chip light emitting diode (FCLED) die.

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Referring to FIGS. 3A-3K, a flip chip light emitting diode (FCLED) die 40 is illustrated. For simplicity, various elements of the flip chip light emitting diode (FCLED) die 40 are not illustrated in all of the figures. However, this type of flip chip light emitting diode (FCLED) die is further described in U.S. Pat. No. 7,615,789, which is incorporated herein by reference.

The flip chip light emitting diode (FCLED) die 40 includes an epitaxial stack 44. As shown in FIG. 3E, the epitaxial stack 44 includes an n-type confinement layer 46, a multiple quantum well (MQW) layer 48 in electrical contact with the n-type confinement layer 46 configured to emit electromagnetic radiation, and a p-type confinement layer 50 in electrical contact with the multiple quantum well (MQW) layer 48.

The n-type confinement layer 46 preferably comprises n-GaN. Other suitable materials for the n-type confinement layer 46 include n-AlGaN, n-InGaN, n-AlInGaN, AlInN and n-AlN. The multiple quantum well (MQW) layer 48 preferably includes one or more quantum wells comprising one or more layers of InGaN/GaN, AlGaInN, AlGaN, AlInN and AlN. The multiple quantum well (MQW) layer 48 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). The p-type confinement layer 50 preferably comprises p-GaN. Other suitable materials for the p-type confinement layer 50 include p-AlGaN, p-InGaN, p-AlInGaN, p-AlInN and p-AlN.

Figure 3A:
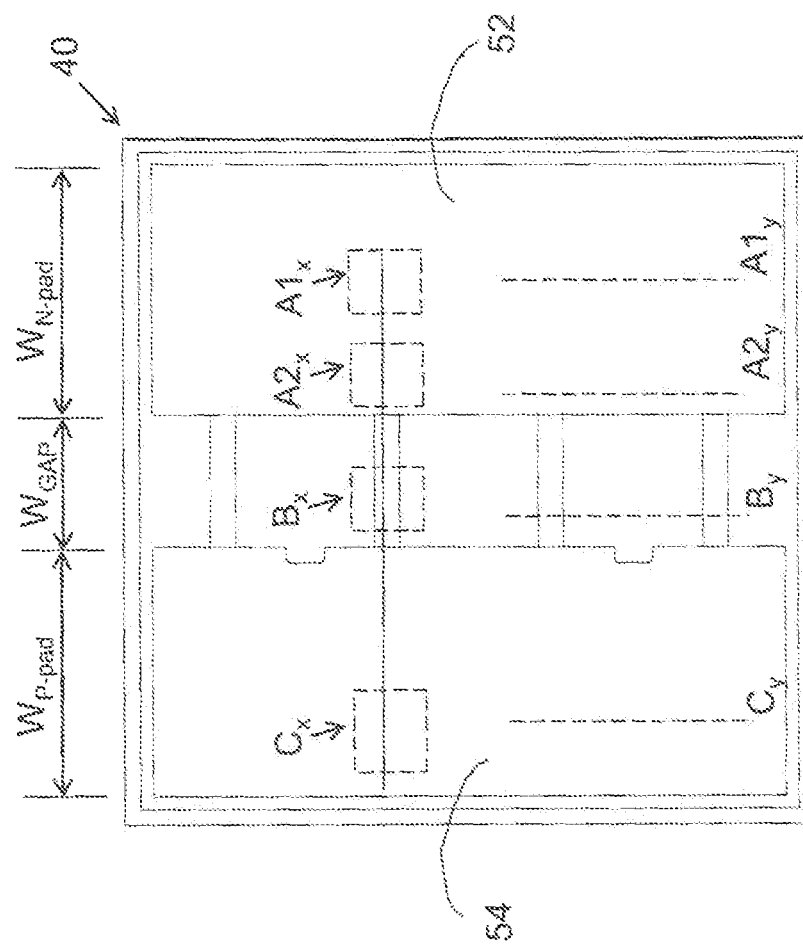
FIG. 3A is a schematic bottom view of a flip chip light emitting diode (FCLED) die having an n-conductor layer.
Figure 3D:
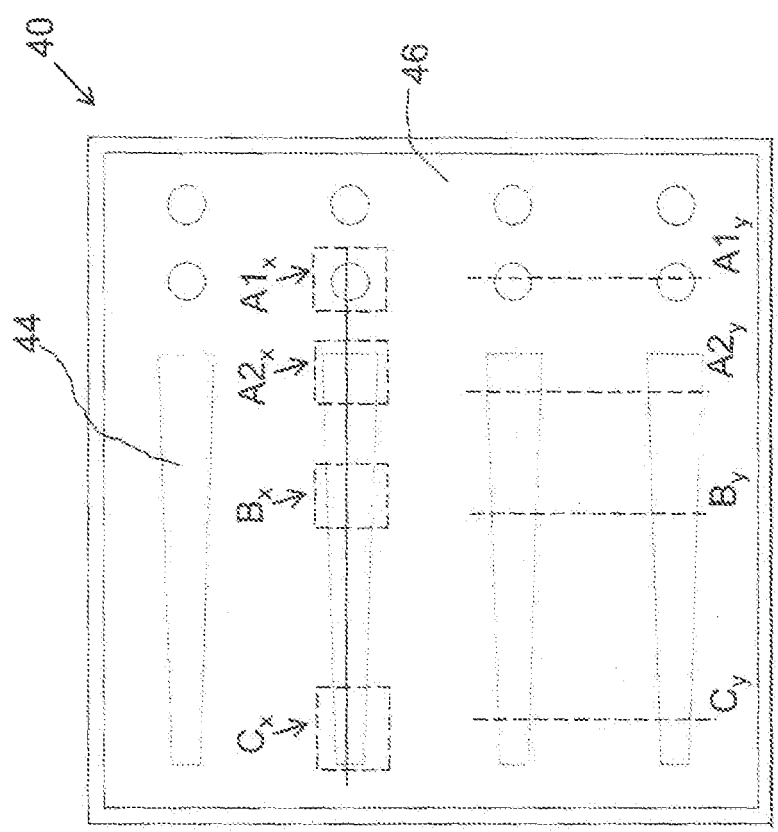
FIG. 3D is a schematic cross sectional view of the flip chip light emitting diode (FCLED) die.
Figure 3K:
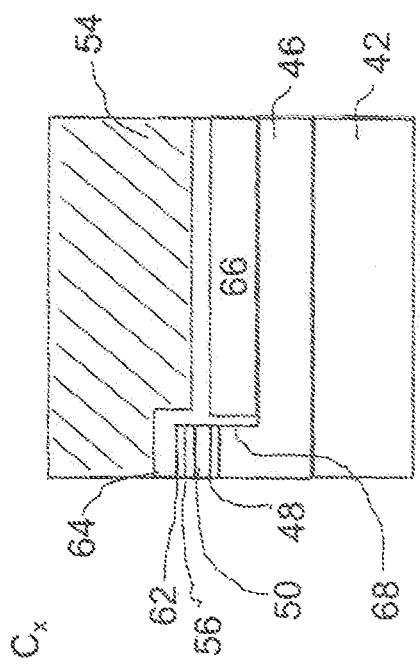
FIG. 3K is an enlarged schematic cross sectional view of the flip chip light emitting diode (FCLED) die taken along line $C_x$.
Figure 3J:
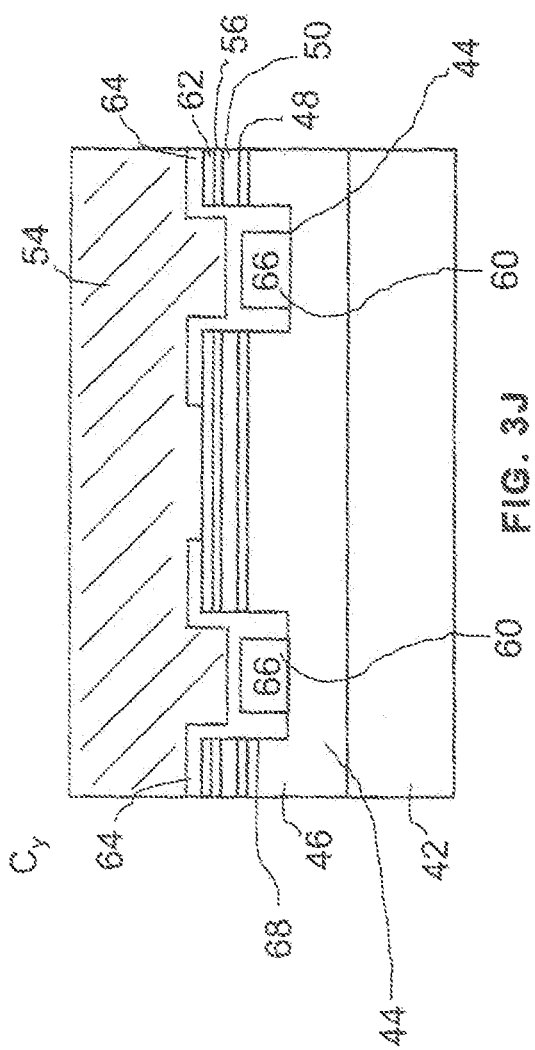
FIG. 3J is an enlarged schematic cross sectional view of the flip chip light emitting diode (FCLED) die taken along line $C_y$.

As shown in FIG. 3A, the flip chip light emitting diode (FCLED) die 40 also includes a plurality of n-pads 52 and a single p-pad 54. Although in the illustrative embodiment multiple n-pads 52 are illustrated, it is to be understood that the flip chip light emitting diode (FCLED) die 40 can be constructed with only a single n-pad 52, or with a plurality of n-pads 52, which are electrically connected into a single n-pad 52. Similarly, the flip chip light emitting diode (FCLED) die 40 can be constructed with a plurality of p-pads 54. The n-pads 52 and the p-pad 54 can comprise a conductive material, such as a single layer of a metal, such as W, Ti, Mo, Al, Cu, Ni, Ag, Au or Co, a metal alloy such as Cu—Co or Cu—Mo, or a metal stack such as Ni/Cu or Ni/Cu—Mo. As also shown in FIG. 3A, the n-pads 52 form a plurality of n-contact areas 58 in electrical contact with the n-type confinement layer 46. It is desirable for the n-contact areas 58 to be as large as possible, to permit a low resistance electrical path between the n-pads 52 and the n-type confinement layer 46.

As shown in FIGS. 3G and 3H, the flip chip light emitting diode (FCLED) die 40 also includes a mirror layer 56 on the p-type confinement layer 50 comprising a highly reflective metal layer configured to reflect the electromagnetic radiation emitted by the multiple quantum well (MQW) layer 48 outward from the (VLED) die 40. The mirror layer 56 can be formed on the p-type confinement layer 50. By way of example, the mirror layer 56 can comprise multiple layers, such as Ni/Ag/Ni/Au, Ag/Ni/Au, Ti/Ag/Ni/Au, Ag/Pt or Ag/Pd or Ag/Cr, formed by depositing an alloy containing Ag, Au, Cr, Pt, Pd, or Al.

As shown in FIGS. 3G and 3H, the flip chip light emitting diode (FCLED) die 40 also includes a plurality of n-conductor layers 60 in electrical contact with the n-pads 52, and in electrical contact with the n-type confinement layer 46. In addition, as shown in FIG. 3F, an electrical isolator layer 64 electrically insulates the n-conductor layers 60 from the p-pad 54. The n-conductor layers 60 can comprise a same metal as the n-pads 52 or a different metal than the n-pads 52. Suitable metals include W, Ti, Mo, Al, Cu, Ni, Ag, Au or Co, a metal alloy such as Cu—Co or Cu—Mo. The electrical isolator layer 64 can comprise an electrically insulating material, such as an oxide (e.g., $SiO_2$, $TiO_2$ $Al_2O_3$, $HfO_2$, $Ta_2O_5$), a polymer (e.g., epoxy, parylene, polyimide, photoresist, EPON Resin Su-8), a nitride (e.g. $Si_3N_4$), or a glass (e.g., BPSG borophosphosilicate glass).

As shown in FIGS. 3G and 3H, the flip chip light emitting diode (FCLED) die 40 also includes a p-metal layer 62 on the mirror layer 56 in electrical contact with the p-type confinement layer 50 and with the p-pad 54. As shown in FIG. 3G, an electrical isolator layer 66 electrically insulates the p-metal layer 62 from the n-pads 52. The p-metal layer 62 can be formed of the same materials as previously described for the n-conductor layers 60, and the electrical isolator layer 66 can be formed of the same materials as previously described for the electrical isolator layer 64.

As shown in FIGS. 3G and 3H, n-trenches 68 are formed in the epitaxial stack 44, and the n-pads 52 and the n-conductor layers 60, are formed in the n-trenches 68. As shown in FIG. 3A, the n-trenches 68 are elongated and generally rectangular shaped trenches, which are oriented generally parallel to the edges of the flip chip light emitting diode (FCLED) die 40, and generally orthogonal to the p-pad 54. As shown in FIGS. 3G and 3H, the n-trenches 68 also extend into the n-type confinement layer 46 with a selected depth and with a selected width $W_T$. In addition, the n-conductor layers 60 are formed at the bottom of the n-trenches 68, in electrical contact with the surface of the n-type confinement layer 46. Each n-conductor layer 60 can be formed with a width $W_S$ that substantially matches a width $W_T$ of the n-trenches 68. Each n-conductor layer 60 can be formed with a length L (FIG. 3H) that is selected to span the width of the gap $W_G$ (FIG. 3A) between the n-pads 52 and the p-pad 54. The length L (FIG. 3H) is also selected such that each n-conductor layer 60 makes electrical contact with an associated n-pad 52 and extends a distance subjacent to an associated p-pad 54.

Figure 5:
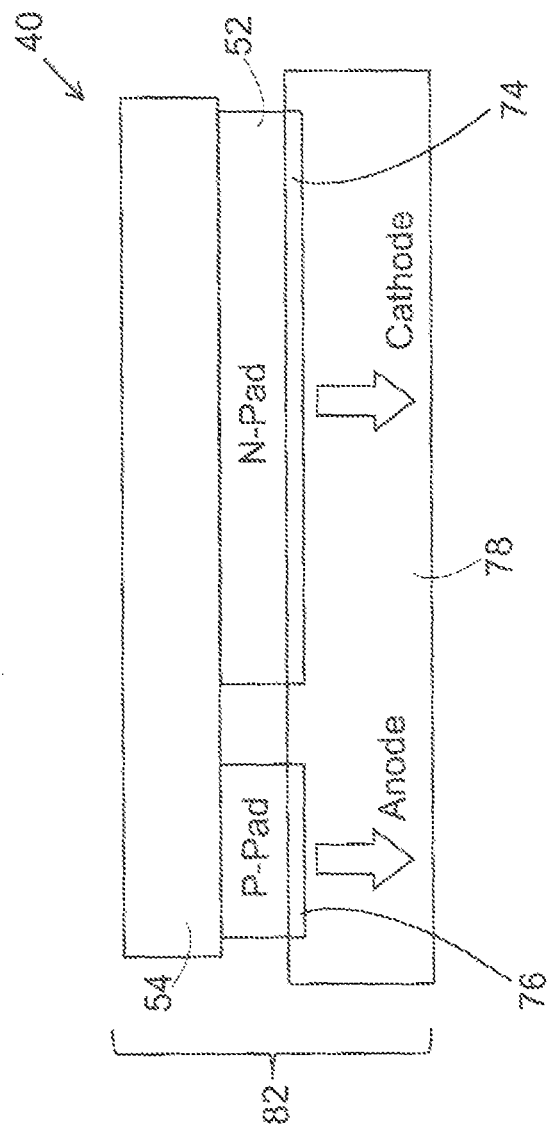
FIG. 5 is a schematic side elevation view of the flip chip light emitting diode (FCLED) die mounted to a module substrate.

The n-conductor layers 60 perform several functions in the flip chip light emitting diode (FCLED) die 40. A first function of the n-conductor layers 60 is to increase the contact areas 58 between the n-pads 52 and the n-type confinement layer 46. This improves current flow in the flip chip light emitting diode (FCLED) die 40 and increases the radiation output. Each n-conductor layer 60 also functions as a strap or conductive trace having an n-end that electrically contact an associated n-pad 52, and having a p-end that extends under the p-pad 54. Although the n-conductor layers 60 are electrically insulated from the p-pad 54 by the electrical isolator layer 64, the radiation output along the outer edge of the p-pad 54 is increased because the distance between the outer edge of the p-pad 54 and the n-conductor layers 60 is less than it would be without the n-conductor layers 60. The n-conductor layers 60 also allow the width $W_P$ (FIG. 3A) of the p-pad 54, the width $W_N$ (FIG. 3A) of the n-pads 52, and the gap width $W_G$ (FIG. 3A) between the n-pads 52 and the p-pad 54 to be adjustable, without requiring additional mask numbers during the fabrication process. In addition, this width adjustability increases the process window during a subsequent packaging process for the flip chip light emitting diode (FCLED) die 40, as the size and spacing of the n-pads 52 and the p-pad 54 can be matched to the size and spacing of n-electrodes 74 (FIG. 5) and a p-electrode 76 (FIG. 5) on a module substrate 78 (FIG. 5).

Figure 4A:
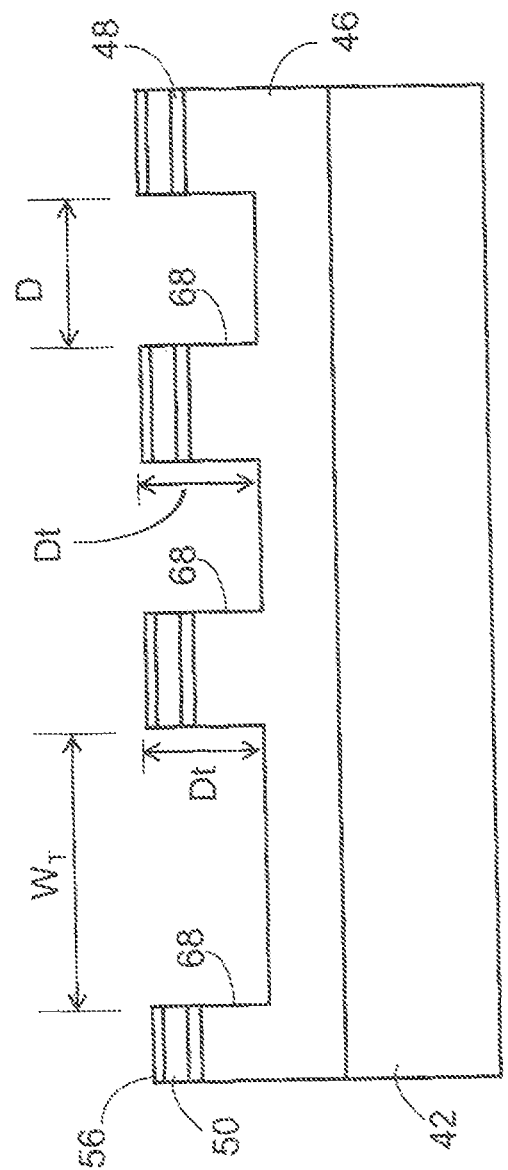
FIGS. 4A, 4B, 4C and 4D are schematic cross sectional views illustrating steps in a method for fabricating the flip chip light emitting diode (FCLED) die.

Referring to FIGS. 4A-4D, steps in a method for fabricating the flip chip light emitting diode (FCLED) die 40 are illustrated. Initially, as shown in FIG. 4A, a carrier substrate 80 can be provided. The carrier substrate 80 can be in the form of a wafer comprised of a suitable material, such as sapphire, silicon carbide (SiC), silicon, germanium, zinc oxide (ZnO), or gallium arsenide (GaAs). In the examples to follow, the carrier substrate 80 comprises sapphire.

As also shown in FIG. 4A, the multi-layer epitaxial stack 44 can be formed on the carrier substrate 80 using a suitable deposition process such as vapor phase epitaxy (VPE), molecular beam epitaxy (MBE) or liquid phase epitaxy (LPE). The multi layer epitaxial stack 44 includes the n-type confinement layer 46, the multiple quantum well (MQW) layer 48, and the p-type confinement layer 50. In the illustrative embodiment, the n-type confinement layer 46 comprises n-GaN and the p-type confinement layer 50 comprises p-GaN. Rather than GaN, the n-type confinement layer 46, and the p-type confinement layer 50 can comprise various other compound semiconductor materials, such as AlGaN, InGaN, and AlInGaN. Multiple quantum well (MQW) layer 48 can be formed of suitable materials such as a GaAs layer sandwiched between two layers of a material with a wider bandgap such as AlAs.

As also shown in FIG. 4A, a mirror layer 56 can be formed on the p-type confinement layer 50 and a thin protective layer (not shown), such as a layer of $SiO_2$ can be formed on the mirror layer 56. By way of example, the mirror layer 56 can comprise multiple layers, such as Ni/Ag/Ni/Au, Ag/Ni/Au, Ti/Ag/Ni/Au, Ag/Pt or Ag/Pd or Ag/Cr, formed by depositing an alloy containing Ag, Au, Cr, Pt, Pd, or Al. A thickness of the mirror layer 56 can be less than about 1.0 µm. High temperature annealing or alloying of the mirror layer 56 can be used to improve the contact resistance and adhesion of the mirror layer 56 to the p-type confinement layer 50. For example, the annealing or alloying process can be conducted at a temperature of at least 150° C. in an inert environment (e.g., an atmosphere containing little or no oxygen, hydrogen, or neither oxygen nor hydrogen).

As also shown in FIG. 4A, a suitable process can be used to form the n-trenches 68 through the epitaxial stack 44 that can extend a selected distance into the n-type confinement layer 46. One suitable process for forming the n-trenches 68 comprises dry etching through a hard mask. After the trench forming process, a liquid or a solvent can be used to remove the etch mask, or other protective coating. A width $W_T$ (FIG. 3A) of the n-trenches 68 can be in the range of at least 0.1 µm.

Figure 4B:
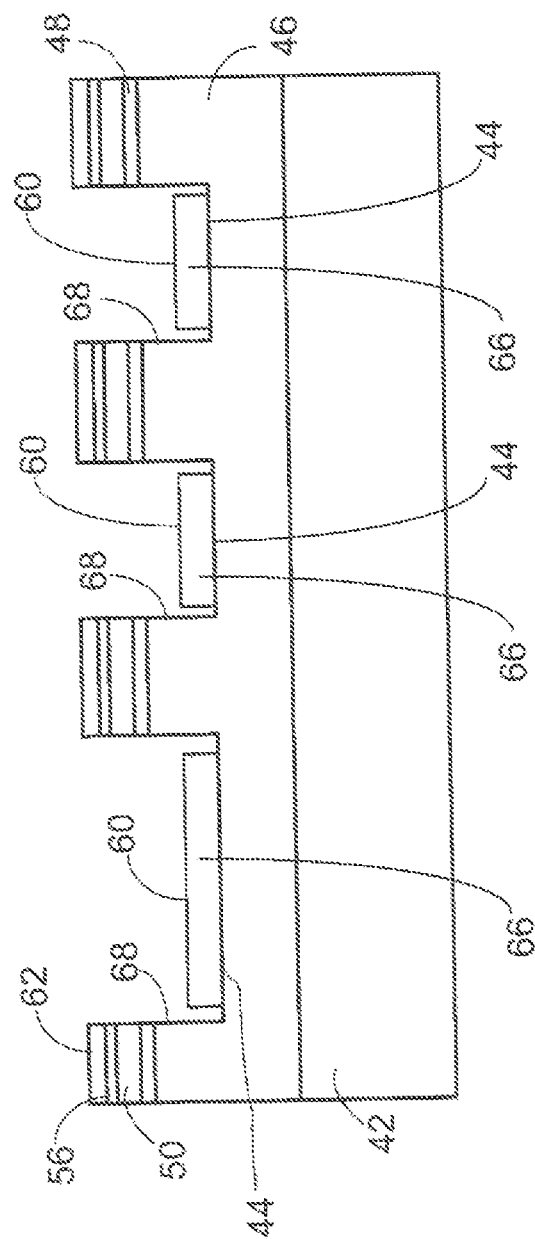

Next, as shown in FIG. 4B, the n-conductor layers 60 can be formed in the n-trenches 68 on the surface of the n-type confinement layer 46. As also shown in FIG. 4B, the p-metal layers 62 can be formed on the p-type confinement layer 50 using the same deposition process or using a separate deposition process. The n-conductor layers 60 and the p-metal layers 62 can comprise a metal layer, a metal alloy or a metal stack as previously described. The n-conductor layers 60 and the p-metal layers 62 can be formed using a suitable deposition process, such as an electro-deposition process or an electroless deposition process, to a desired thickness (e.g., 0.1 µm to 500 µm) and with the previously described sizes and shapes. Other suitable deposition processes for forming the n-conductor layers 60 and the p-metal layers 62 can include chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

Figure 4C:
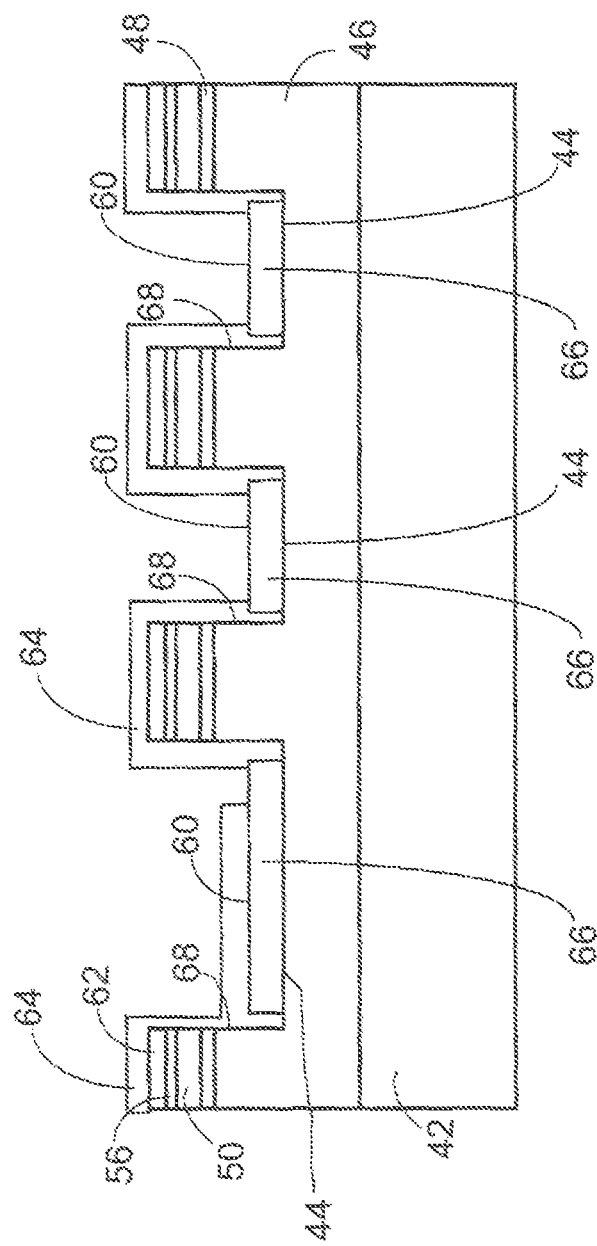

Next, as shown in FIG. 4C, the electrical isolator layers 64 and the electrical isolator layers 66 can be formed using a suitable deposition or growth process. As previously described, the electrical isolator layers 64 and the electrical isolator layers 66 can comprise an electrically insulating material, such as an oxide (e.g., $SiO_2$, $TiO_2$ $Al_2O_3$, $HfO_2$, $Ta_2O_5$), a polymer (e.g., epoxy, parylene, polyimide, photoresist, EPON Resin Su-8), a nitride (e.g. $Si_3N_4$), or a glass (e.g., BPSG borophosphosilicate glass).

Figure 4D:
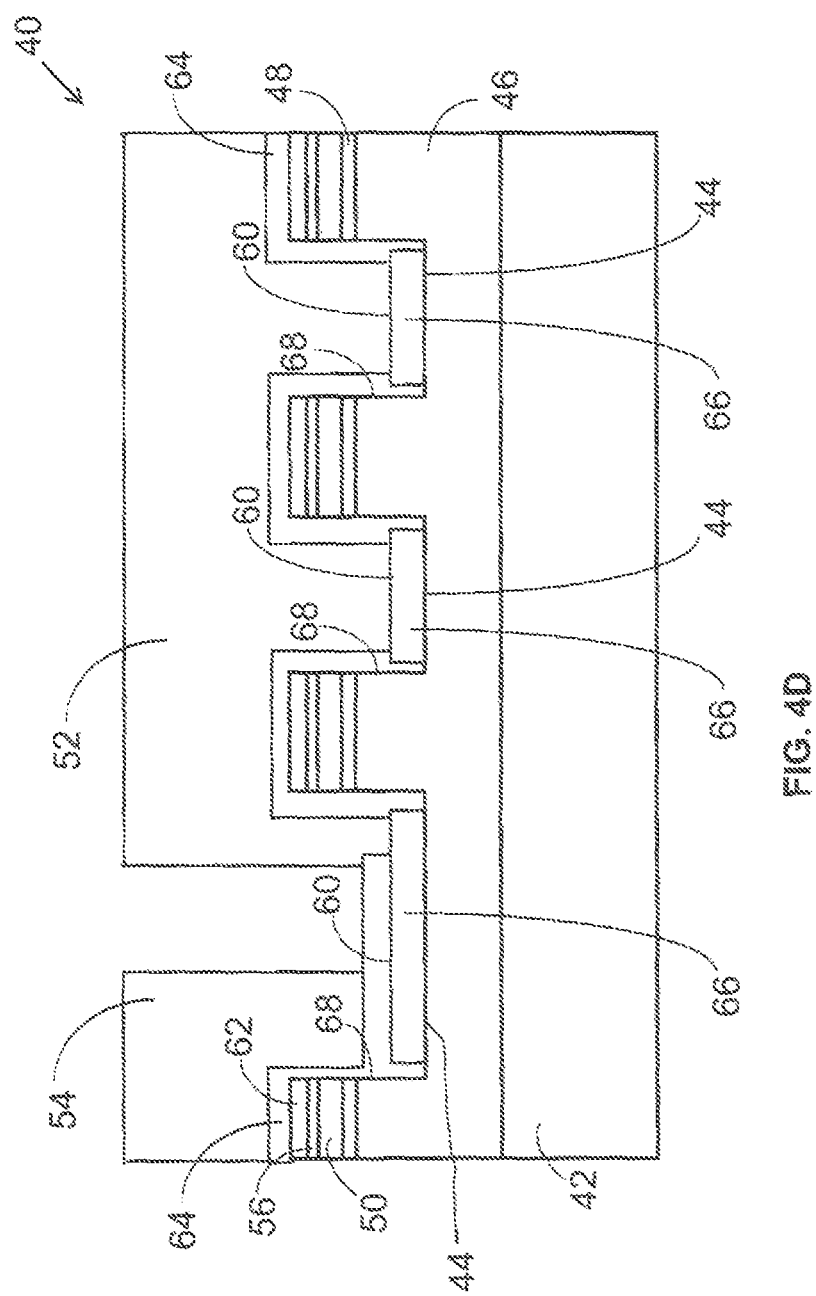

Next, as shown in FIG. 4D, the p-pad 54 can be formed on the electrical isolator layers 64 and the n-pads 52 can be formed on the electrical isolator layers 66. The p-pad 54 and the n-pads 52 can comprise a metal layer, a metal alloy or a metal stack formed using a suitable process such as etching an initially deposited layer (e.g., subtractive process), or alternately patterned deposition through a mask (e.g., additive process). For example, a deposition process, such as an electro-deposition process or an electroless deposition process can be used to deposit metal layer to a desired thickness (e.g., 0.1 µm to 500 µm). Other suitable deposition processes include chemical vapor deposition (CVD), metal-organic chemical vapor deposition (MOCVD), plasma enhanced chemical vapor deposition (PECVD), molecular beam epitaxy (MBE), vapor phase epitaxy (VPE), physical vapor deposition (PVD), evaporation, and plasma spray.

Following these process steps, the carrier substrate 80 can be removed using a suitable process such a laser pulsing, chemical mechanical planarization (CMP), grinding or etching. In addition, a separating process can be performed using a suitable process such as laser dicing, sawing, breaking, air knifing or water jetting to singulate the individual flip chip light emitting diode (FCLED) dice 40. For simplicity, these steps are not shown.

The flip chip light emitting diode (FCLED) die 40 can have a desired peripheral shape and a selected size range of from at least 100 µm on a side (S). However, this shape and size range is by way of example and other polygonal, circular and oval shapes and size ranges can be employed. A representative size range for the width $W_P$ of the p-pad 54 can be from at least 20 µm. A representative size range for the gap width $W_G$ can be from at least 20 µm. A representative size range for the width $W_T$ (FIG. 3A) of the n-trenches 68 can be from at least 20 µm and the length of the n-trenches 68 can be from about at least 20 µm. Again, all of these size ranges are intended to be exemplary and not limiting in scope.

As shown in FIG. 5, the flip chip light emitting diode (FCLED) die 40 can be flip chip mounted to a module substrate 78 to form a VLED system 82. During a flip chip bonding process, the p-pad 54 can be bonded to the p-electrode 76 on the module substrate 78 to provide an anode, and the n-pads 52 can be bonded to the n-electrodes 74 on the module substrate 78 to provide a cathode. Suitable bonding processes include soldering, reflow or conductive adhesive bonding.

The present disclosure is directed to a flip chip light emitting diode (FCLED) die having n-conductors that permit the size of the gap $W_G$, as well as the width of the width $W_P$ of the p-pad 54 and the width $W_N$ of the n-pads 52 to be adjusted, to provide optimal radiation output, and a large process window for packaging. The improved flip chip light emitting diode (FCLED) die 40 and method for fabricating the (FCLED) die provide at least several advantages.

First, the electrical flow distance between the p-pad 54 and n-pads 52 shrinks due to the n-conductor layers 60. This will improve the output radiation, while decreasing or maintaining fabrication costs, regardless of the values for the gap width $W_G$, the width $W_P$ of the p-pad 54, and the width $W_N$ of the n-pads 52. Additionally, the fabrication method accommodates different sizes for the gap width $W_G$, the width $W_P$ of the p-pad 54, and the width $W_N$ of the n-pads 52. This provides design flexibility without increasing manufacturing costs. Second, the n-conductor layers 60 provide additional flexibility for designing the sizes of p-pad 54, the n-pads 52, and gap width $W_G$, which facilitates the packaging process. This also permits flexibility in the alignment of the p-pad 54 and the n-pads 52 to the electrodes 74, 76 on the module substrate 78. Third, additional masks and additional process steps are not required, which not only improves yield, but also decreases the cost of manufacturing, and saves the time of manufacturing as well.

While the description has been with reference to certain preferred embodiments, as will be apparent to those skilled in the art, certain changes and modifications can be made without departing from the scope of the following claims.

What is claimed is:

1. A method for fabricating a flip chip light emitting diode (FCLED) die comprising:
    forming an epitaxial stack on a carrier substrate having an n-type confinement layer, a multiple quantum well (MQW) layer on the n-type confinement layer configured to emit electromagnetic radiation, and a p-type confinement layer on the multiple quantum well (MQW) layer;
    forming a mirror layer on the p-type confinement layer;
    forming an n-conductor layer on the n-type confinement layer and a p-metal layer on the p-type confinement layer;
    forming a first electrical isolator layer on the n-conductor layer and a second electrical isolator layer on the p-metal layer;
    forming a p-pad on the first electrical isolator layer electrically isolated from the n-conductor layer by the first electrical isolator layer; and
    forming an n-pad on the second electrical isolator layer in electrical contact with the n-conductor layer and electrically isolated from the p-metal layer by the second electrical isolator layer.

2. The method of claim 1 further comprising forming an n-trench in the n-type confinement layer and the forming the n-conductor layer step forms the conductor layer as a conductive trace in the trench having an n-end in electrical contact with the n-pad, and a p-end located subjacent to but electrically isolated from the p-pad.

3. The method of claim 1 wherein the p-pad and the n-pad are separated by a gap having a $W_G$ and the n-conductor layer comprises a conductive trace spanning the gap.

4. The method of claim 1 wherein the p-pad has a width of $W_P$, the n-pad has a width of $W_N$ and the n-conductor layer comprises a conductive trace having a length (L) configured to allow the width $W_P$ and the width $W_N$ to be adjusted.

5. The method of claim 1 wherein the n-pad comprises a plurality of n-pads and the n-conductor layer comprises a plurality of n-conductor layers configured as conductive traces in electrical contact with the n-pads.

6. A method for fabricating a flip chip light emitting diode (FCLED) die comprising:
    providing an epitaxial stack comprising a p-type confinement layer, a multiple quantum well (MQW) layer in electrical contact with the p-type confinement layer configured to emit electromagnetic radiation, and an n-type confinement layer in electrical contact with the multiple quantum well (MQW) layer having a trench;
    forming a mirror layer on the p-type confinement layer;
    forming a p-metal layer on the mirror layer in electrical contact with the p-type confinement layer;
    forming a p-pad in electrical communication with the p-type confinement layer via the p-metal layer;
    forming an n-pad in electrical contact with the n-type confinement layer via an n-contact area;
    forming an n-conductor layer in electrical contact with the n-type confinement layer configured to increase the n-contact area between the n-pad and the n-type confinement layer;
    forming a first electrical isolator layer on the n-conductor layer configured to electrically insulate the n-conductor layer from the p-pad; and forming a second electrical isolator layer on the p-type confinement layer configured to electrically insulate the n-pad from the p-metal layer, wherein the p-pad has a width of $W_P$, the n-pad has a width of $W_N$ and the n-conductor layer comprises a conductive trace having a length (L) configured to allow the width $W_P$ and the width $W_N$ to be adjusted.

7. The method of claim 6 wherein the p-pad and the n-pad are separated by a gap having a $W_G$ and the n-conductor layer comprises a conductive trace spanning the gap.

8. The method of claim 6 wherein the conductive trace includes an n-end in electrical contact with the n-pad, and a p-end located subjacent to the p-pad.

9. The method of claim 6 wherein the n-pad comprises a plurality of n-pads and the n-conductor layer comprises a plurality of n-conductor layers configured as conductive traces in electrical contact with the n-pads.

10. The method of claim 6 wherein the p-pad has a width of $W_P$, the n-pad has a width of $W_N$ and the n-conductor layer comprises a conductive trace having a length (L) configured to allow the width $W_P$ and the width $W_N$ to be adjusted.

* * * * *